(12) United States Patent
Kountz et al.

(10) Patent No.: US 7,638,413 B2
(45) Date of Patent: Dec. 29, 2009

(54) METHOD OF FABRICATING SEMICONDUCTOR BY NITROGEN DOPING OF SILICON FILM

(75) Inventors: Michael Kountz, Gilbert, AZ (US); George Engle, Scottsdale, AZ (US); Steven Evers, Chandler, AZ (US)

(73) Assignee: Pan Jit Americas, Inc., Tempe, AZ (US)

( * ) Notice: Subject to any disclaimer, the term of this patent is extended or adjusted under 35 U.S.C. 154(b) by 479 days.

(21) Appl. No.: 11/097,445

(22) Filed: Apr. 4, 2005

(65) Prior Publication Data

US 2005/0233553 A1     Oct. 20, 2005

Related U.S. Application Data

(63) Continuation of application No. PCT/US03/31217, filed on Oct. 3, 2003.

(60) Provisional application No. 60/415,516, filed on Oct. 3, 2002.

(51) Int. Cl.
*H01L 21/20*     (2006.01)

(52) U.S. Cl. .................. 438/482; 438/485; 438/791
(58) Field of Classification Search .............. 438/96, 438/480, 482, 485, 513, 758, 791, 792
See application file for complete search history.

(56) References Cited

U.S. PATENT DOCUMENTS

| 5,557,122 | A | * | 9/1996 | Shrivastava et al. | 257/315 |
| 5,631,189 | A | * | 5/1997 | Kobayashi et al. | 438/448 |
| 5,894,151 | A | * | 4/1999 | Yamazaki et al. | 257/347 |
| 6,080,645 | A | * | 6/2000 | Pan | 438/585 |
| 6,166,428 | A | * | 12/2000 | Mehta et al. | 257/315 |
| 2004/0106278 | A1 | * | 6/2004 | Xu et al. | 438/637 |

* cited by examiner

*Primary Examiner*—Kevin M Picardat

(57) ABSTRACT

A method of fabricating a semiconductor uses chemical vapor deposition, or plasma-enhanced chemical vapor deposition, to deposit an amorphous silicon film on an exposed surface of a substrate, such as ASIC wafer. The amorphous silicon film is doped with nitrogen to reduce the conductivity of the film and/or to augment the breakdown voltage of the film. Nitrogen gas, $N_2$, is activated or ionized in a reactor before it is deposited on the substrate.

15 Claims, 9 Drawing Sheets

METHOD OF FABRICATING SEMICONDUCTOR BY NITROGEN DOPING OF SILICON FILM

CROSS REFERENCE TO RELATED APPLICATIONS

This application is a continuation of PCT/US2003/31217 filed on Oct. 3, 2003 in the name of the same inventors which is based on U.S. Provisional Patent Application Ser. No. 60/415,516 which was filed on Oct. 3, 2002 in the name of the same inventors.

TECHNICAL FIELD

The present invention relates, in general, to the manufacturing of semiconductors with deposited silicon films, and, in particular, to the doping of an amorphous silicon film to achieve desired electrical properties in the film.

BACKGROUND OF THE INVENTION

Chemical vapor deposition and plasma-enhanced chemical vapor deposition are processes that are widely used to fabricate semiconductor devices.

Chemical vapor deposition (CVD) is a chemical reaction in which gaseous molecules called precursors are transformed into a thin film on the surface of a substrate, such as an application-specific integrated circuit (ASIC) wafer.

Plasma-enhanced chemical vapor deposition (PECVD) is a similar process which occurs in a reactor wherein a strong electric field causes decomposition of a gaseous compound into a plasma (of highly ionized gases). This reaction leads to precipitation of a film onto the substrate surface.

CVD and PECVD processes for the fabrication of semiconductor devices typically use amorphous silicon rather than crystalline silicon. Crystalline silicon naturally exists as a lattice structure in which each silicon atom is tetrahedrally bonded to four neighboring silicon atoms. Amorphous silicon (a-Si) is the "non-crystalline" form of silicon. Amorphous silicon is replete with defects known as "dangling bonds", i.e., silicon atoms that are not tetrahedrally bonded. Amorphous silicon is also referred to as "undercoordinated" because not all of its atoms are "four-fold coordinated" with four neighboring atoms.

For fabrication of semiconductors, however, pure amorphous silicon has been found to contain too many defects (i.e., too many dangling bonds). Because pure amorphous silicon has such a high density of defects (dangling bonds), trapped charges have a proclivity to recombine. Recombination is a phenomenon whereby a free electron traveling in the vicinity of a hole forms a covalent bond, thus reducing the number of charge carriers. Therefore, to limit the likelihood of recombination, engineers and other persons skilled in the art have resorted to hydrogenated amorphous silicon (a-Si:H). The electrical properties of hydrogenated amorphous silicon are superior to those of pure amorphous silicon because the former contain fewer dangling bonds.

One way to control the electrical properties of a semiconductor is to vary the number of charge carriers. The process of doping, which is well known in the art, is a commonly used way of introducing impurities in order to control the number of charge carriers in the semiconductor. Usually, semiconductors are doped to increase the number of charge carriers and thus to increase the conductivity of the semiconductor.

In general, there are two types of doping. N-type doping involves doping with a donor element which donates a free electron to the lattice structure of the semiconductor. The resulting semiconductor is known as an N-type semiconductor P-type doping involves doping with an acceptor element which removes an electron to make a hole in the structure. The resulting semiconductor is known as a p-type semiconductor.

For CVD and PECVD film deposition processes, doping is also known in the art as a technique to the modify the electrical properties of the film. For n-type doping, a dopant such as phosphine ($PH_3$) may be used. For p-type doping, a dopant such as diborane ($B_2H_6$) may be used. These dopants are added to the process gas in order to introduce elementary phosphor or boron, as the case may be, into the new silicon film.

One of the shortcomings of semiconductor films made of deposited amorphous silicon is that the film is often too conductive or does not possess a sufficiently high breakdown voltage to be useful in certain applications where these electrical properties are either necessary or desirable. Accordingly, a method of fabricating a semiconductor film that reduces the conductivity and/or increases the breakdown voltage of the deposited film remains highly desirable.

SUMMARY OF THE INVENTION

A main object of the present invention is to overcome at least some of the deficiencies of the above-noted prior art.

This object is achieved by the elements defined in the appended independent claims. Optional features and alternative embodiments are defined in the subsidiary claims.

Thus, an aspect of the present invention provides a method of fabricating a semiconductor by chemical vapor deposition of an amorphous silicon film on an exposed surface of a substrate, in which the amorphous silicon film is doped with nitrogen.

Preferably, the source of nitrogen is $N_2$ gas which is first activated, or ionized, prior to deposition.

An advantage of the present invention is that the nitrogen-doping of the deposited amorphous silicon film has reduced conductivity and a higher breakdown voltage, electrical properties that are desirable for certain semiconductor applications.

Another aspect of the present invention provides a semiconductor device having a nitrogen-doped silicon film exhibiting reduced conductivity and/or a higher breakdown voltage.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
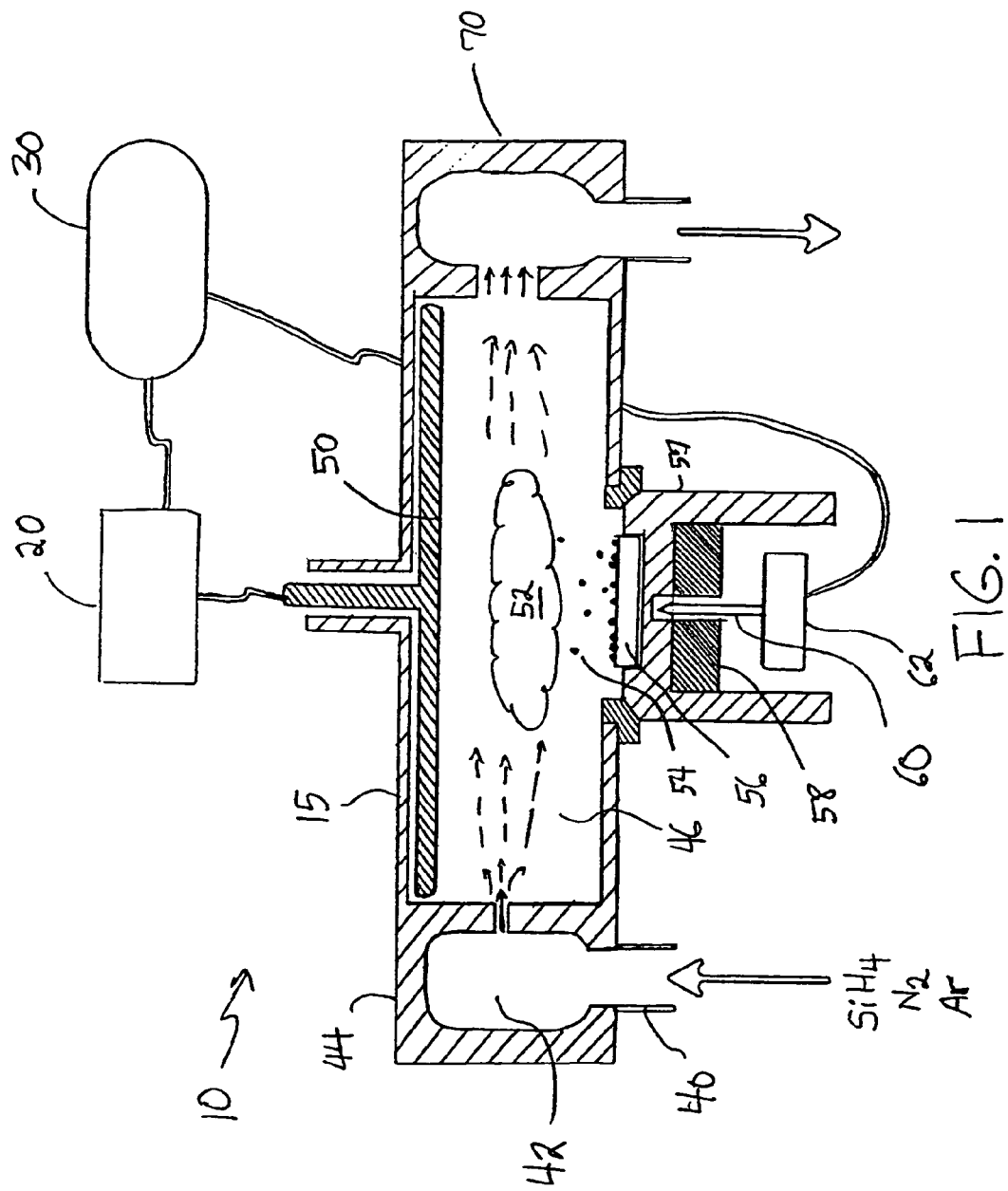
FIG. 1 is schematic cross-sectional view of a PECVD reactor used to deposit the nitrogen-doped amorphous silicon film in accordance with the present invention.

FIG. 1 illustrates schematically a plasma-enhanced chemical vapor deposition (PECVD) process whereby amorphous silicon is doped with nitrogen and deposited as a film on a substrate or carrier such as an ASIC wafer. The PECVD process shown in FIG. 1 uses a PECVD reactor system, such as the (Advanced Semiconductor Materials "ASM") ASM Plasma III System, which is designated generally by the reference numeral 10.

The PECVD reactor system 10 has a reactor 15, a power source 20 for generating radio-frequency power in the reactor and a control unit 30 for controlling various reaction parameters, as will be elaborated below. The reactor has a gas manifold 40 for the intake of precursors or reagents. The precursors are silane, or $SiH_4$, (as the source of silicon), $N_2$ for nitrogen doping, and an inert gas such as Argon to facilitate ionization. The precursors enter a gas reservoir 42 in an injector head 44. The injector head 44 injects the precursor gases into a reaction chamber 46 where the precursors are activated, or ionized. The power source 20 provides electrical power to a radio-frequency electrode 50 which ionizes the silane and nitrogen gases. The ionization of these gases creates plasma 52. The activated silane and nitrogen gases then precipitate as solid particles 54 (i.e. the solid particulates "deposit") onto a substrate 56 such as ASIC wafer. The substrate 56 is usually positioned atop a wafer carrier (not illustrated) which is held in place by a substrate holder 57.

To optimize the deposition process, the substrate 56 is heated by a substrate heater 58. The temperature of the substrate is measured by a thermocouple 60 which is connected to a transducer 62 which sends a signal to the control unit 30. The control unit 30 controls the substrate heater 58 to maintain the temperature within an optimal range.

The reactor 15 also includes a vacuum pump system 70 which is used to evacuate the reaction chamber to maintain an optimally low pressure for vapor deposition to proceed.

Figure 2:
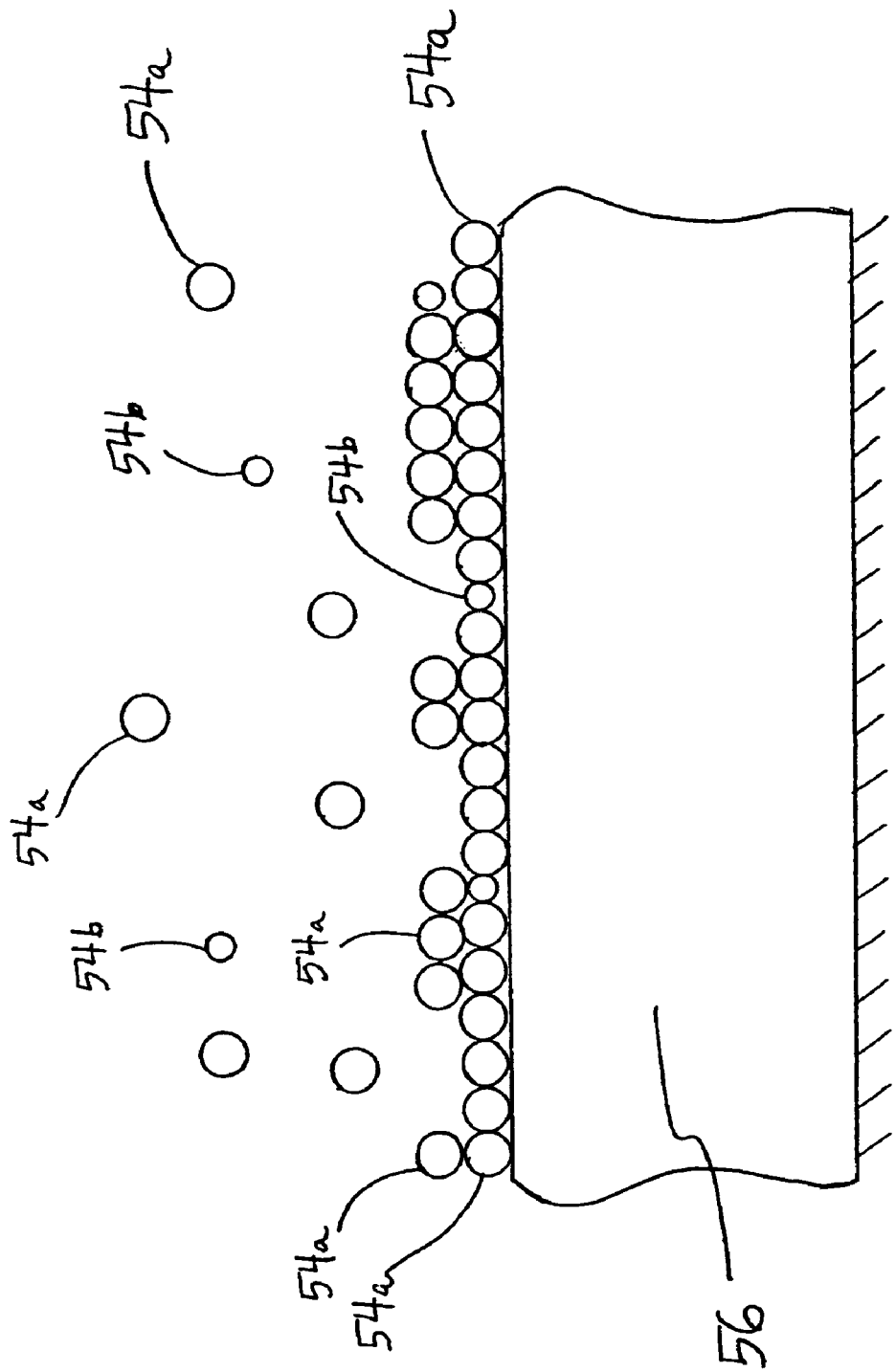
FIG. 2 is schematic cross-sectional view of deposition of nitrogen-doped amorphous silicon film on a substrate in accordance with the present invention.

FIG. 2 illustrates, in exaggerated schematic form, the chemical vapor deposition of silicon particles 54a and nitrogen particles 54b onto the upper surface of the substrate (such as an ASIC wafer). The presence of the nitrogen as a dopant reduces the conductivity of the film and increases the breakdown voltage of the film. The ratio of nitrogen to silicon is not meant to be accurate. The $N_2$ doping of amorphous silicon film can be accomplished not only by PECVD but also by regular chemical vapor deposition (CVD). Persons skilled in the art will also appreciate that the nitrogen gas can also be activated by microwave energy, laser or ultraviolet light.

By depositing amorphous silicon film and doping the film with nitrogen, a semiconductor film can thus be manufactured which has specific and desirable electrical properties such as reduced conductivity and higher breakdown voltage. Because of the nitrogen-doped film, the resulting semiconductor device can thus be used in applications where lower conductivity and higher breakdown voltage are desirable or necessary.

By varying certain process parameters, it is possible to control the resulting electrical properties of the nitrogen-doped amorphous silicon film. By varying these process parameters, the conductivity and breakdown voltage may be altered or optimized for a specific application. The relevant process parameters are nitrogen flow, silane flow, pressure, temperature, RF power, "On Time" and "Off Time." Each of these process parameters will be discussed with reference empirical data collected by the inventors, which is presented herein both in tabular and graphical forms.

Figure 3:
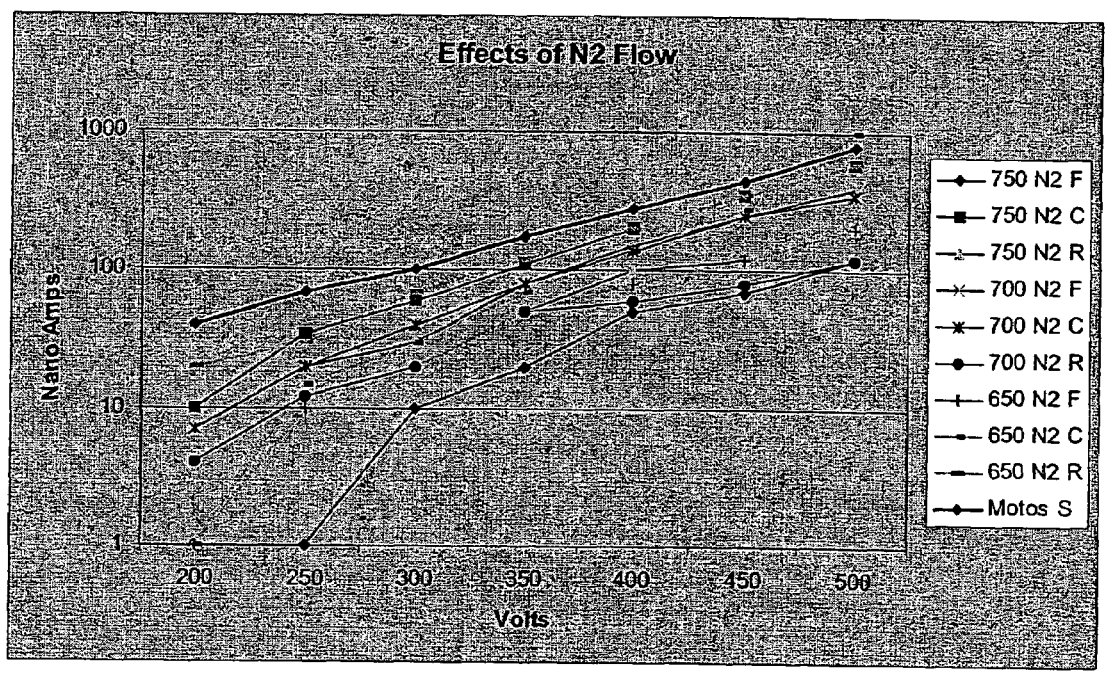
FIG. 3 is a graphical representation of Table 1, showing the effects of $N_2$ flow on conductivity.

The conductivity and breakdown voltage of the nitrogen-doped deposited amorphous silicon film has been found to vary with the flow of nitrogen gas, or $N_2$, as shown In Table 1 below and graphically in FIG. 3.

TABLE 1

Effect of Nitrogen Flow on Conductivity

| N2 Flow | Wafer | Voltage in Bold Face and results are in Nano-Amps | | | | | | |
|---|---|---|---|---|---|---|---|---|
| sccm | Postion | 200 | 250 | 300 | 350 | 400 | 450 | 500 |
| 750 N2 | F | 1 | 1 | 10 | 20 | 50 | 70 | 120 |
|  | C | 10 | 35 | 60 | 110 | 200 | 350 | 600 |
|  | R | 1 | 10 | 20 | 50 | 100 | 120 | 200 |
| 700 N2 | F | 7 | 20 | 30 | 80 | 150 | 250 | 400 |
|  | C | 7 | 20 | 40 | 80 | 140 | 250 | 350 |
|  | R | 4 | 12 | 20 | 50 | 60 | 80 | 120 |
| 650 N2 | F | 1 | 10 | 20 | 50 | 80 | 120 | 200 |
|  | C | 1 | 15 | 30 | 70 | 140 | 275 | 1000 |
|  | R | 20 | 30 | 70 | 120 | 200 | 350 | 600 |
| Motos | S | 40 | 70 | 100 | 175 | 275 | 450 | 800 |

Figure 4:
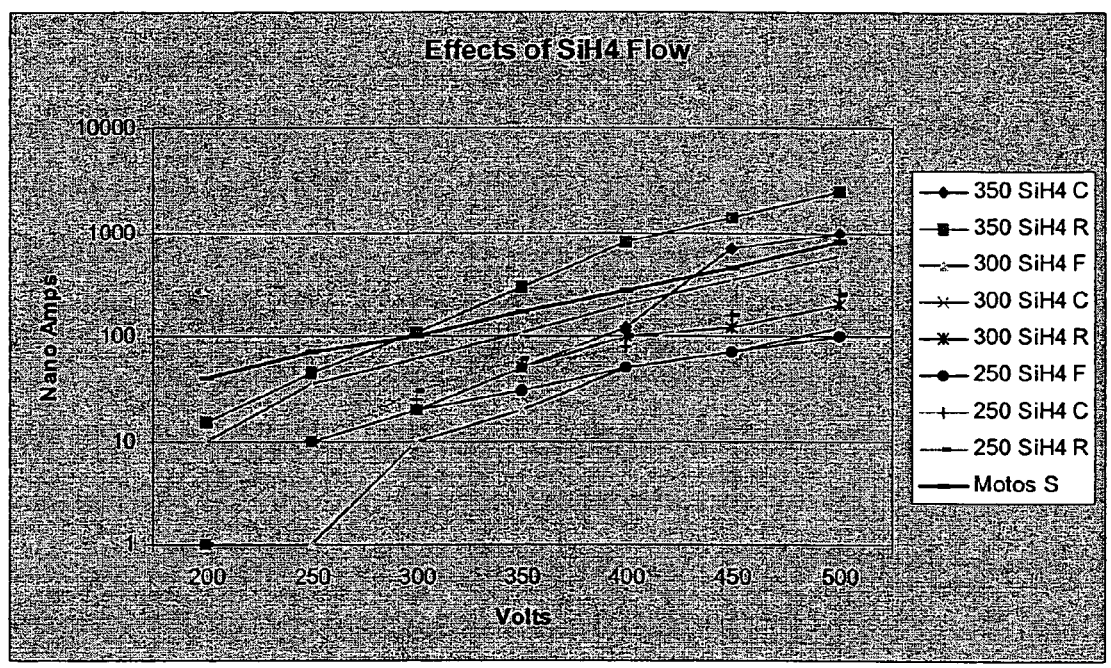
FIG. 4 is a graphical representation of Table 2, showing the effects of $SiH_4$ flow on conductivity.

The conductivity and breakdown voltage of the nitrogen-doped silicon film can also be controlled by varying the flow of silane, or $SiH_4$. Empirical data on the effect of varying the silane flow is tabulated below in Table 2 and represented graphically in FIG. 4.

TABLE 2

Effect of Silane Flow on Conductivity

| SiH4 Flow | Wafer | Voltage in Bold Face and results are in Nano-Amps | | | | | | |
|---|---|---|---|---|---|---|---|---|
| sccm | Postion | 200 | 250 | 300 | 350 | 400 | 450 | 500 |
| 350 SiH4 | F | 1 | 10 | 20 | 50 | 120 | 300 | 500 |
|  | C | 1 | 10 | 20 | 50 | 120 | 700 | 1000 |
|  | R | 15 | 45 | 110 | 300 | 800 | 1400 | 2500 |
| 300 SiH4 | F | 1 | 1 | 10 | 20 | 50 | 70 | 120 |
|  | C | 10 | 35 | 60 | 110 | 200 | 350 | 600 |
|  | R | 1 | 10 | 20 | 50 | 100 | 120 | 200 |
| 250 SiH4 | F | 1 | 10 | 20 | 30 | 50 | 70 | 100 |
|  | C | 1 | 10 | 25 | 50 | 80 | 160 | 250 |
|  | R | 1 | 10 | 30 | 60 | 100 | 160 | 250 |
| Motos | S | 40 | 70 | 100 | 175 | 275 | 450 | 800 |

Figure 5:
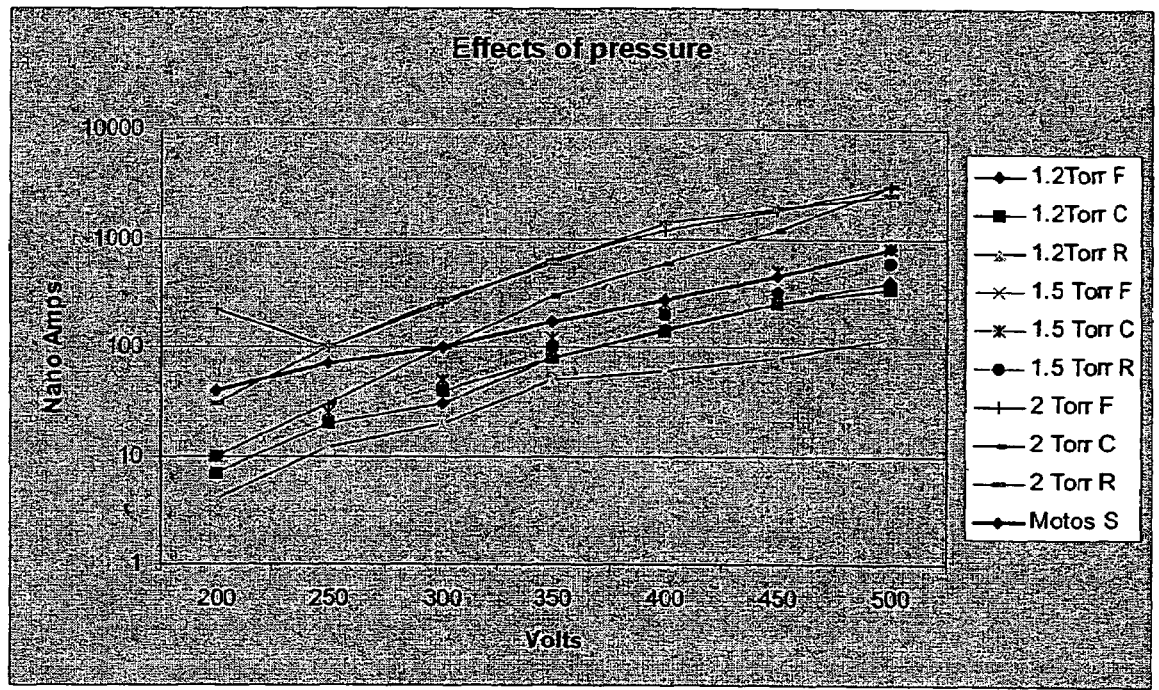
FIG. 5 is a graphical representation of Table 3, showing the effects of process pressure on conductivity.

Variations in pressure were shown to have an effect on the conductivity and breakdown voltage of the nitrogen-doped silicon film. Empirical data on the effect of varying the process pressure are tabulated below in Table 3 and represented graphically in FIG. 5.

TABLE 3

Effect of Temperature Variations on Conductivity

| Temp | Postion | 200 | 250 | 300 | 350 | 400 | 450 | 500 |
|---|---|---|---|---|---|---|---|---|
| 350 Temp | F | 20 | 50 | 80 | 100 | 200 | 300 | 1000 |
|  | C | 10 | 20 | 30 | 100 | 200 | 450 | 700 |
|  | R | 15 | 20 | 30 | 60 | 120 | 250 | 450 |
| 380 Temp | F | 1 | 1 | 10 | 20 | 50 | 70 | 120 |
|  | C | 10 | 35 | 60 | 110 | 200 | 350 | 600 |
|  | R | 1 | 10 | 20 | 50 | 100 | 120 | 200 |
| 400 Temp | F | 20 | 40 | 70 | 120 | 225 | 350 | 550 |
|  | C | 20 | 40 | 80 | 200 | 400 | 600 | 1200 |
|  | R | 10 | 30 | 70 | 200 | 500 | 700 | 1000 |
| Motos | S | 40 | 70 | 100 | 175 | 275 | 450 | 800 |

Figure 6:
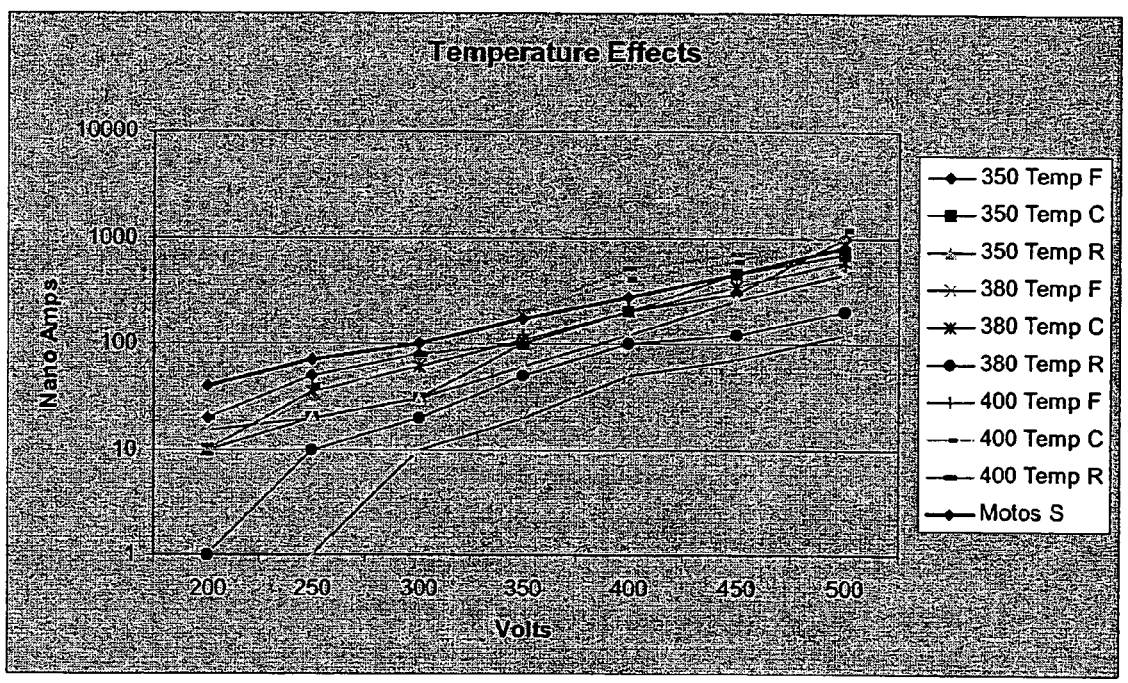
FIG. 6 is a graphical representation of Table 4, showing the effects of process temperature on conductivity.

Variations in temperature were also shown to have an effect on the conductivity and breakdown voltage of the nitrogen-doped silicon film. Empirical data on the effect of varying the process temperature are tabulated below in Table 4 and represented graphically in FIG. 6.

TABLE 4

Effect of Variation in Pressure on Conductivity

| | Wafer | Voltage In Bold Face and results are in Nano-Amps | | | | | | |
|---|---|---|---|---|---|---|---|---|
| Press. | Postion | 200 | 250 | 300 | 350 | 400 | 450 | 500 |
| 1.2 Torr | F | 7 | 20 | 30 | 80 | 150 | 250 | 400 |
|  | C | 7 | 20 | 40 | 80 | 140 | 250 | 350 |
|  | R | 4 | 12 | 20 | 50 | 60 | 80 | 120 |
| 1.5 Torr | F | 10 | 22 | 44 | 100 | 200 | 350 | 650 |
|  | C | 10 | 25 | 50 | 120 | 250 | 500 | 800 |
|  | R | 10 | 20 | 40 | 100 | 200 | 325 | 600 |
| 2 Torr | F | 225 | 100 | 250 | 650 | 1200 | 1800 | 3000 |
|  | C | 10 | 30 | 100 | 300 | 600 | 1200 | 3000 |
|  | R | 30 | 100 | 270 | 600 | 1400 | 1900 | 2500 |
| Motos | S | 40 | 70 | 100 | 175 | 275 | 450 | 800 |

Figure 7:
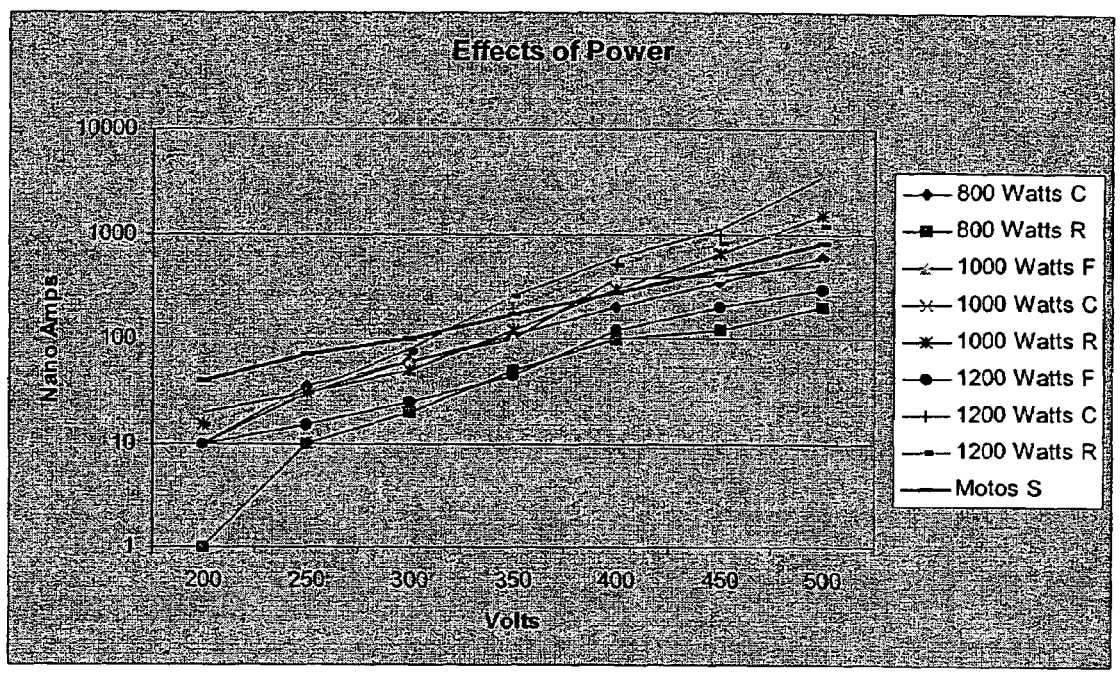
FIG. 7 is a graphical representation of Table 5, showing the effects of radio frequency power on conductivity.

Variations in the applied radio-frequency (RF) power were also shown to have an effect on the conductivity and breakdown voltage of the deposited film. Empirical data on the effect of varying the RF power are tabulated below in Table 5 and represented graphically in FIG. 7.

TABLE 5

Effect of Variations In RF Power on Conductivity

| | Wafer | Voltage in Bold Face and results are in Nano-Amps | | | | | | |
|---|---|---|---|---|---|---|---|---|
| RF Power St. Point | Postion | 200 | 250 | 300 | 350 | 400 | 450 | 500 |
| 800 Watts | F | 1 | 1 | 10 | 20 | 50 | 70 | 120 |
|  | C | 10 | 35 | 60 | 110 | 200 | 350 | 600 |
|  | R | 1 | 10 | 20 | 50 | 100 | 120 | 200 |
| 1000 Watts | F | 10 | 30 | 60 | 100 | 375 | 400 | 500 |
|  | C | 20 | 30 | 80 | 250 | 600 | 1100 | 3500 |
|  | R | 15 | 30 | 50 | 120 | 300 | 650 | 1500 |
| 1200 Watts | F | 10 | 15 | 25 | 45 | 120 | 200 | 300 |
|  | C | 15 | 30 | 70 | 190 | 500 | 1000 | 1500 |
|  | R | 15 | 30 | 75 | 250 | 500 | 800 | 1200 |
| Motos | S | 40 | 70 | 100 | 175 | 275 | 450 | 800 |

Figure 8:
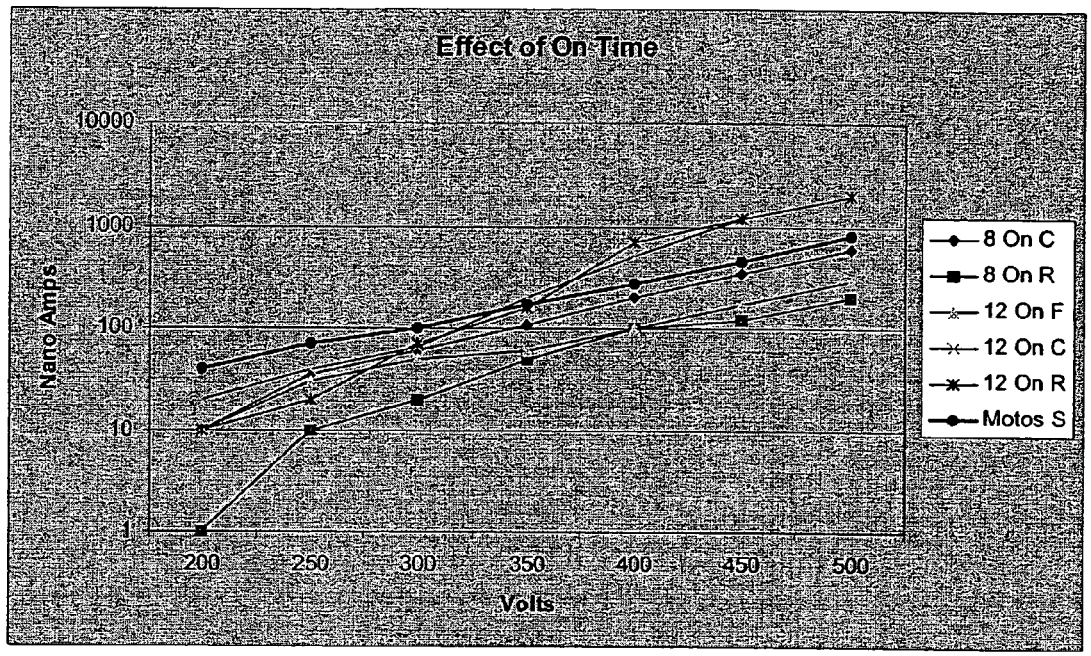
FIG. 8 is a graphical representation of Table 6, showing the effects of "On Time" on conductivity.

The inventors observed that varying the "on time" had an effect on the resulting conductivity and breakdown voltage of the deposited film. Empirical data on the effect of varying the "on time" are tabulated below in Table 6 and represented graphically in FIG. 8.

TABLE 6

Effect of Variations in "On Time" on Conductivity

| | Wafer | Voltage in Bold Face and results are In Nano-Amps | | | | | | |
|---|---|---|---|---|---|---|---|---|
| On Time | Postion | 200 | 250 | 300 | 350 | 400 | 450 | 500 |
| 8 On | F | 1 | 1 | 10 | 20 | 50 | 70 | 120 |
|  | C | 10 | 35 | 60 | 110 | 200 | 350 | 600 |
|  | R | 1 | 10 | 20 | 50 | 100 | 120 | 200 |
| 12 On | F | 10 | 30 | 50 | 60 | 100 | 175 | 300 |
|  | C | 20 | 40 | 65 | 200 | 500 | 1200 | 2000 |
|  | R | 10 | 20 | 70 | 160 | 700 | 1200 | 2000 |
| Motos | S | 40 | 70 | 100 | 175 | 275 | 450 | 800 |

Figure 9:
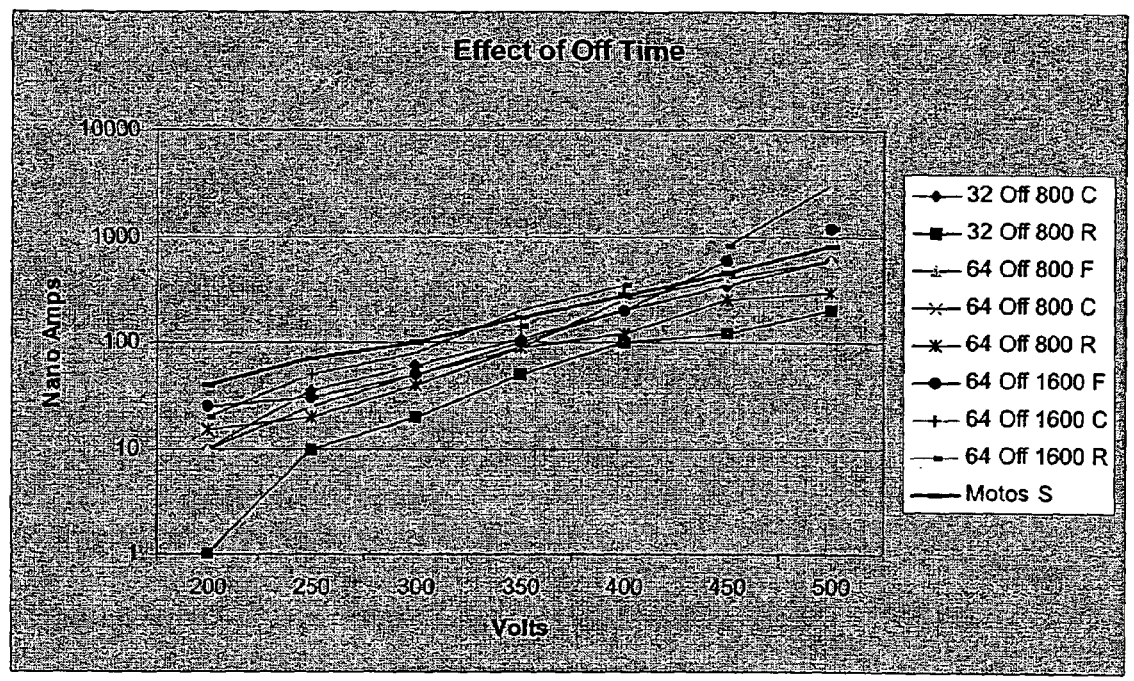
FIG. 9 is a graphical representation of Table 7, showing the effects of "Off Time" on conductivity.

The inventors observed that varying the "off time" also had an effect on the resulting conductivity and breakdown voltage of the deposited film. Empirical data on the effect of varying the "off time" are tabulated below in Table 7 and represented graphically in FIG. 9.

TABLE 7

Effect of Variations in "Off Time" on Conductivity

| | Wafer | Voltage in Bold Face and results are in Nano-Amps | | | | | | |
|---|---|---|---|---|---|---|---|---|
| Off Time | Postion | 200 | 250 | 300 | 350 | 400 | 450 | 500 |
| 32 Off 800 | F | 1 | 1 | 10 | 20 | 50 | 70 | 120 |
|  | C | 10 | 35 | 60 | 110 | 200 | 350 | 600 |
|  | R | 1 | 10 | 20 | 50 | 100 | 120 | 200 |
| 64 Off 800 | F | 10 | 25 | 50 | 90 | 250 | 400 | 600 |
|  | C | 20 | 50 | 80 | 200 | 350 | 800 | 3000 |
|  | R | 15 | 20 | 40 | 90 | 120 | 250 | 300 |
| 64 Off 1600 | F | 25 | 30 | 50 | 100 | 200 | 600 | 1200 |
|  | C | 25 | 50 | 60 | 140 | 300 | 600 | 1200 |
|  | R | 20 | 30 | 60 | 140 | 350 | 800 | 1200 |
| Motos | S | 40 | 70 | 100 | 175 | 275 | 450 | 800 |

In light of the foregoing experimental results, an amorphous silicon film with low conductivity and high breakdown voltage could, for example, be manufactured using a PECVD process run with the following process parameters: nitrogen flow of 700 (standard cubic centimeters "sccm") sccm; silane flow of 300 sccm; temperature of 380 degrees Celsius; pressure of 1200 mTorr; RF power of 800 Watts; On Time of 8 m/sec; and Off Time of 32 m/sec.

The embodiment(s) of the invention described above is (are) intended to be exemplary only. The scope of the invention is therefore intended to be limited solely by the scope of the appended claims.

We claim:

1. A method of fabricating a component of a semiconductor structure by chemical vapor deposition of an amorphous silicon film on an exposed surface of a substrate, CHARACTERISED IN THAT the amorphous silicon film is doped with nitrogen; and
    parameters of the vapor deposition being varied to control the electrical properties of the nitrogen doped silicon film to have a high resistivity and to prevent surface electrical breakdown of the semiconductor structure.

2. A method as claimed in claim 1, CHARACTERISED IN THAT the nitrogen is N2.

3. A method as claimed in claim 2, CHARACTERISED IN THAT the N2 is flowed at 650 to 750 sccm.

4. A method as claimed in claim 2, CHARACTERISED IN THAT the nitrogen is activated prior to deposition.

5. A method as claimed in claim 4, CHARACTERISED IN THAT the nitrogen is activated by radio-frequency energy.

6. A method as claimed in claim 5, CHARACTERISED IN THAT the radio-frequency energy is from 800 to 1200 Watts.

7. A method as claimed in claim 4, CHARACTERISED IN THAT the nitrogen is activated by microwave energy.

8. A method as claimed in claim 4, CHARACTERISED IN THAT the nitrogen is activated by laser.

9. A method as claimed in claim 4, CHARACTERISED IN THAT the nitrogen is activated by ultraviolet light.

10. A method as claimed in claim 5, CHARACTERISED IN THAT the silicon film is doped with nitrogen in a vacuum chamber.

11. A method as claimed in claim 10, CHARACTERISED IN THAT an inert gas and a silicon-based gas are present in the vacuum chamber.

12. A method as claimed in claim 6, CHARACTERISED IN THAT the nitrogen is activated by ionization in a plasma-enhanced chemical vapor deposition (PECVD) reactor.

13. A method as claimed in claim 1, CHARACTERISED IN THAT the substrate is an application-specific integrated circuit (ASIC) wafer.

14. A method as claimed in claim 1 CHARACTERISED IN THAT the film exhibits reduced conductivity after doping with nitrogen.

15. A method as claimed in claim 1 CHARACTERISED IN THAT the film has a higher breakdown voltage after doping with nitrogen.

* * * * *